(12) United States Patent
Yang et al.

(10) Patent No.: US 10,593,284 B2
(45) Date of Patent: Mar. 17, 2020

(54) SHIFT REGISTER UNIT AND METHOD FOR DRIVING SAME, SHIFT REGISTER CIRCUIT AND DISPLAY APPARATUS

(71) Applicants: Boe Technology Group Co., Ltd., Beijing (CN); Hefei Xinsheng Optoelectronics Technology Co., Ltd., Anhui (CN)

(72) Inventors: Tong Yang, Beijing (CN); Rui Ma, Beijing (CN); Guolei Wang, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 146 days.

(21) Appl. No.: 14/912,635

(22) PCT Filed: Jul. 29, 2015

(86) PCT No.: PCT/CN2015/085394
§ 371 (c)(1),
(2) Date: Feb. 18, 2016

(87) PCT Pub. No.: WO2016/101618
PCT Pub. Date: Jun. 30, 2016

(65) Prior Publication Data
US 2016/0351159 A1    Dec. 1, 2016

(30) Foreign Application Priority Data
Dec. 26, 2014    (CN) .......................... 2014 1 0828440

(51) Int. Cl.
*G11C 19/00*    (2006.01)
*G09G 5/00*    (2006.01)
(Continued)

(52) U.S. Cl.
CPC ............... *G09G 5/003* (2013.01); *G09G 3/20* (2013.01); *G11C 19/28* (2013.01); *G09G 3/3677* (2013.01);
(Continued)

(58) Field of Classification Search
None
See application file for complete search history.

(56) References Cited

U.S. PATENT DOCUMENTS

2010/0111245 A1    5/2010    Tobita
2011/0058640 A1*   3/2011    Shang ................. G11C 19/184
                                                                  377/64
(Continued)

FOREIGN PATENT DOCUMENTS

CN    102629444       8/2012
CN    102915698 A     2/2013
(Continued)

OTHER PUBLICATIONS

International Search Report and Written Opinion for International Application No. PCT/CN2015/085394, dated Oct. 19, 2015, 10 pages.
(Continued)

*Primary Examiner* — Tuan T Lam
(74) *Attorney, Agent, or Firm* — Westman, Champlin & Koehler, P.A.

(57) ABSTRACT

The present disclosure provides provide a shift register unit and a method for driving the shift register unit, a shift register circuit and a display apparatus. The shift register unit comprises: a charging module connected to an input terminal and a pull-up node and configured to generate a pull-up signal; a pull-up module connected to the pull-up node, a first clock signal terminal and an output terminal of the shift register unit, and configured to charge the output
(Continued)

terminal of the shift register unit; a first pull-down control module connected to a second clock signal terminal, the pull-up node, a low voltage terminal and a pull-down control node, and configured to generate a pull-down control signal; a second pull-down control module connected to the pull-down control node, the pull-up node, the second clock signal terminal, the low voltage terminal and the pull-down node, and configured to generate a pull-down signal; a first pull-down module connected to a first reset terminal, the output terminal of the shift register unit and the low voltage terminal, and configured to discharge the output terminal of the shift register unit; a second pull-down module connected to a pull-down node, the second clock signal terminal, the output terminal of the shift register unit, the pull-up node and the low voltage terminal, and configured to discharge the output terminal of the shift register unit; and a reset module connected to a second reset terminal, the pull-up node and the low voltage terminal, and configured to reset the pull-up node.

17 Claims, 8 Drawing Sheets

(51) Int. Cl.
    *G09G 3/20*     (2006.01)
    *G11C 19/28*     (2006.01)
    *G09G 3/36*     (2006.01)

(52) U.S. Cl.
    CPC ............... *G09G 2300/0426* (2013.01); *G09G 2310/0251* (2013.01); *G09G 2310/0267* (2013.01); *G09G 2310/0286* (2013.01); *G09G 2310/08* (2013.01); *G09G 2320/0223* (2013.01); *G09G 2320/0252* (2013.01); *G09G 2330/021* (2013.01)

(56) References Cited

U.S. PATENT DOCUMENTS

| | | | |
|---|---|---|---|
| 2012/0139883 A1* | 6/2012 | Lee | G09G 3/3611 345/204 |
| 2012/0194489 A1* | 8/2012 | Iwamoto | G09G 3/3685 345/204 |
| 2012/0326955 A1* | 12/2012 | Ohara | G09G 3/3677 345/92 |
| 2013/0088265 A1 | 4/2013 | Chen | |
| 2013/0141318 A1* | 6/2013 | Kim | G09G 3/36 345/87 |
| 2014/0072093 A1 | 3/2014 | Shang et al. | |
| 2015/0187323 A1* | 7/2015 | Jin | G09G 5/003 345/215 |
| 2016/0125954 A1* | 5/2016 | Gu | G11C 19/28 377/64 |
| 2016/0155422 A1* | 6/2016 | Sun | G09G 3/20 345/213 |
| 2016/0187917 A1* | 6/2016 | Lou | G09G 3/2096 345/213 |
| 2016/0268004 A1* | 9/2016 | Li | G11C 19/28 |
| 2016/0300542 A1* | 10/2016 | Zhang | G11C 19/28 |
| 2017/0039968 A1* | 2/2017 | Chen | G09G 3/3648 |
| 2017/0140729 A1* | 5/2017 | Sueki | G11C 19/28 |

FOREIGN PATENT DOCUMENTS

| | | |
|---|---|---|
| CN | 104464600 | 3/2015 |
| CN | 204406959 | 6/2015 |
| KR | 10-2014-0024994 | 3/2014 |
| WO | 2013155851 A1 | 10/2013 |

OTHER PUBLICATIONS

English translation of Box No. V from the Written Opinion of the International Searching Authority for International Application No. PCT/CN2015/085394, 2 pages.

Extended European Search Report from European Patent Application No. 15871692.8, dated Sep. 27, 2017, 12 pages.

* cited by examiner

Prior Art

Fig. 1

Prior Art

Fig. 2

Prior Art

Fig. 3

Prior Art

SHIFT REGISTER UNIT AND METHOD FOR DRIVING SAME, SHIFT REGISTER CIRCUIT AND DISPLAY APPARATUS

CROSS-REFERENCE TO RELATED APPLICATION(S)

This application is a U.S. National Phase Application of International Application No. PCT/CN2015/085394, filed on Jul. 29, 2015, entitled "SHIFT REGISTER UNIT AND METHOD FOR DRIVING SAME, SHIFT REGISTER CIRCUIT AND DISPLAY APPARATUS," which claims priority to Chinese Application No. 201410828440.6, filed on Dec. 26, 2014, both of which are incorporated herein by reference in their entirety.

TECHNICAL FIELD

The present disclosure relates to display technology, and more particularly, to a shift register unit and a method for driving the shift register unit, a shift register circuit and a display apparatus.

BACKGROUND

Flat panel displays have become increasingly popular due to their ultra-thin dimensions and low power consumption. Shift registers are used in most flat panel displays. In shift registers implemented with the Gate Drive on Array (GOA) technique, gate drive Integrated Circuits (ICs) can be omitted and thus a manufacturing process can be removed, thereby reducing the manufacturing costs for the flat panel displays while shortening their manufacturing period to some extent.

Figure 1:
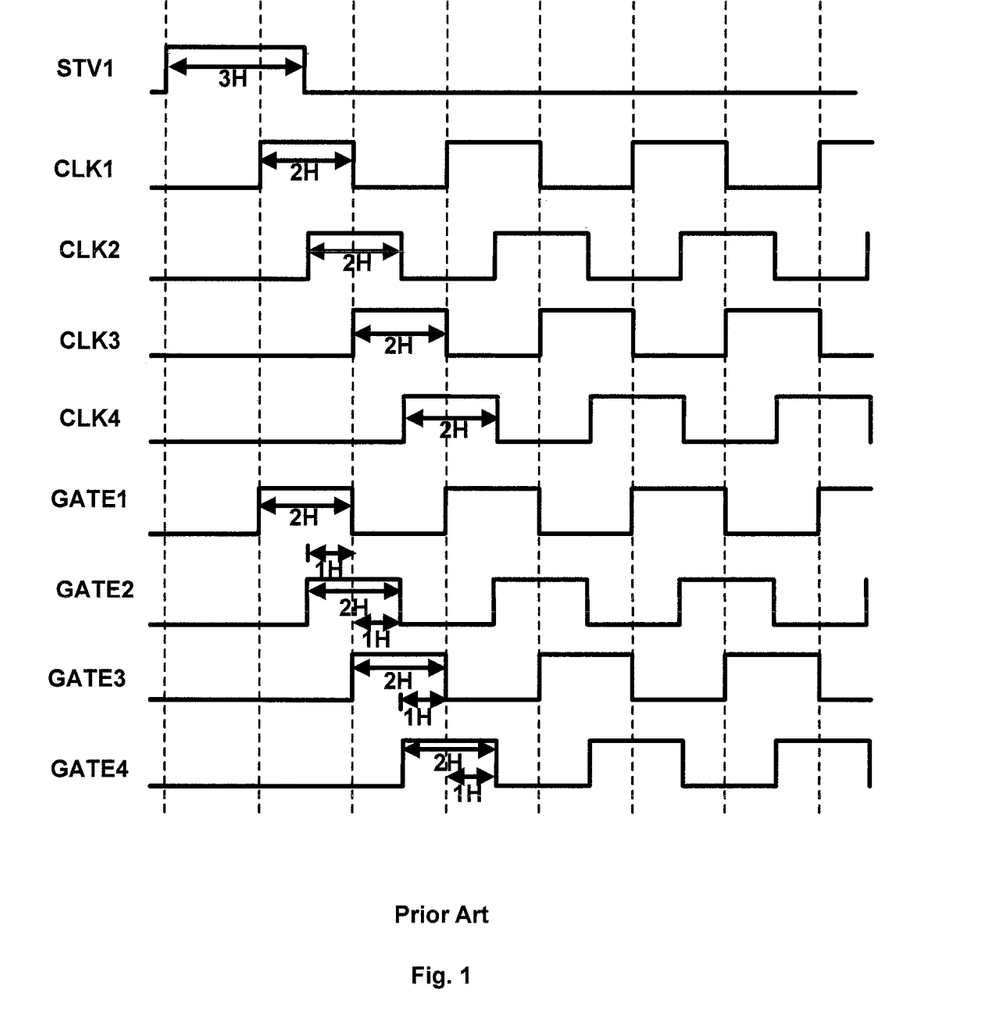
FIG. 1 is a timing sequence for a shift register circuit having a traditional GOA design.
Figure 2:
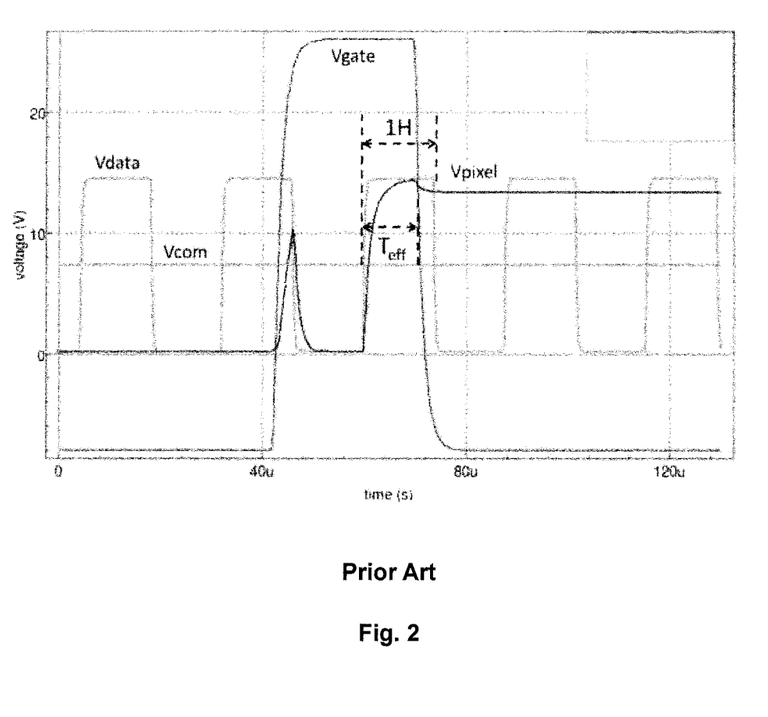
FIG. 2 is a schematic diagram showing a relationship between the actual charging time for a gate line and the effective charging time of a pixel in a traditional GOA design.

Hence, the GOA technique has been widely applied to manufacturing of flat panel displays recently. A GOA unit itself has a higher power consumption than a typical gate drive IC. In order to reduce the power consumption of the GOA unit itself, four or more clock (CLK) signals are typically used (the number of clock signals is a multiple of 2) and the frequencies of the clock signals can be reduced, so as to reduce the power consumption. With such design, in each clock period, the high level duration will be longer than the time required for scanning one line by a factor of n (where n is an integer larger than or equal to 2) and two clock signals of adjacent timing sequences will overlap. As shown in FIG. 1, the actual charging period for each gate line is the interval indicated as 2H. With the overlap, each gate line can be turned on in advance and will be fully turned on when a pixel voltage is actually written into that line. In this way, the impact of a rising edge time (Tr) of a gate signal caused by the resistive and capacitive loads of the gate line itself on the charging time can be reduced. Due to the signal delay caused by the parasitic resistance and capacitance of the gate line itself, in order to ensure a correct voltage to be written into each pixel in operation of the display screen, the data signal for each pixel typically needs to be turned off after the gate signal has been turned off. As shown in FIG. 2, the difference between the time at which the gate signal (Vgate) is turned off and the time at which the data signal (Vdata) is turned off mainly depends on a falling edge time (Tf) of the gate signal caused by the resistive and capacitive loads of the gate line itself. That is, the longer Tf is, the shorter the effective charging time (Teff) for each pixel will be. As shown in FIG. 2, Teff<1H.

Figure 3:
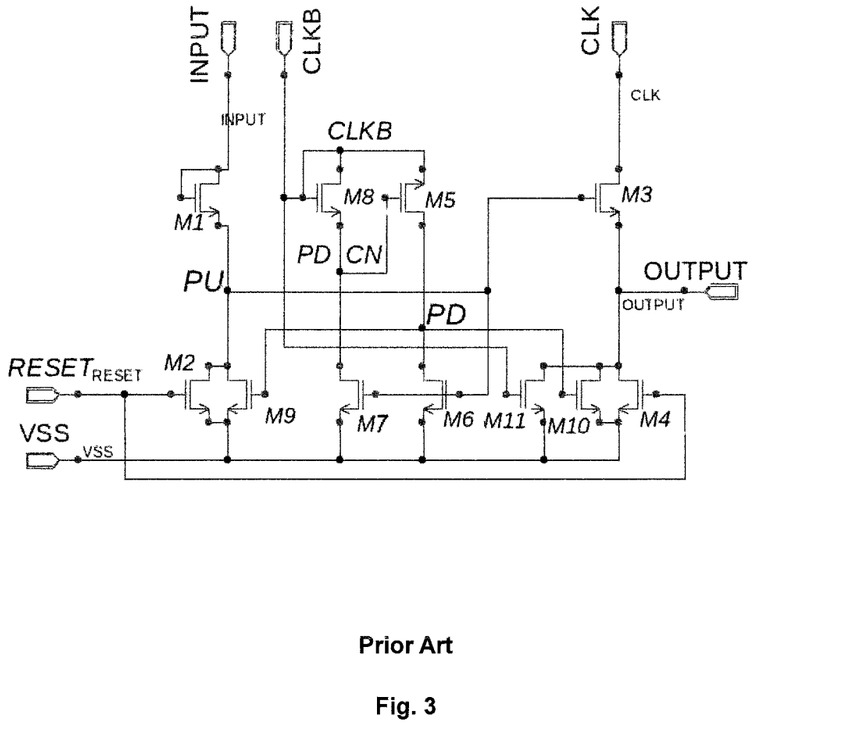
FIG. 3 is a circuit diagram of a shift register unit having a traditional GOA design.
Figure 4:
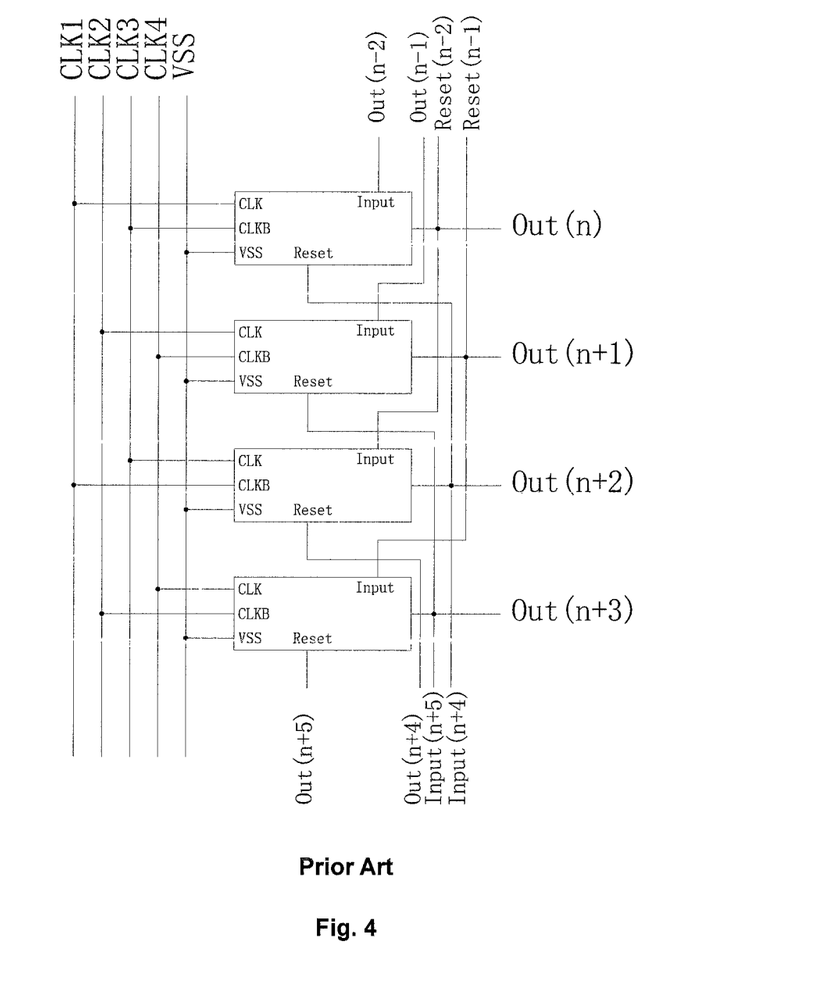
FIG. 4 is a block diagram of a shift register circuit including a number of cascaded shift register units of FIG. 3.

FIG. 3 shows a specific circuit of a shift register unit implemented with the conventional GOA design. FIG. 4 shows a block diagram of a shift register circuit including a number of cascaded shift register units shown in FIG. 3. Here, the timing sequences of the respective clock signals are shown in FIG. 1. In FIG. 3, the transistors M3 and M4 charge and discharge the output terminal (OUTPUT), respectively. A high level signal is output at the output terminal when the gate of the transistor M3 is at the high level and the clock signal (CLK) is at the high level. Once the scanning of one gate line has completed, the CLK becomes low and the reset signal (RESET) becomes high. At this time, the transistors M2 and M4 are turned on for discharging the gate of the transistor M3 and the output terminal. In this case, the transistors M3 and M4 are in the off and on states, respectively and accordingly only the transistor M4 discharges the output terminal. As shown in FIG. 4, in addition to driving the n-th gate line, the output of the n-th register unit resets the (n−2)-th register unit and serves as the input to the (n+2)-th register unit. In this way, the shift register circuit implemented with the conventional GOA technical can only reduce the impact of Tr on the effective charging time of the pixels by reducing Tr.

For those products having high resolutions or high refreshing rates, the charging time for the pixels is very short. Accordingly, the impact of Tf on the effective charging time of the pixels will be more significant.

SUMMARY

It is an object of the present disclosure to provide a shift register unit and a method for driving the shift register unit, a shift register circuit and a display apparatus, capable of solving the above problem associated with a short effective charging time (Teff) of pixels due to a long falling edge time (Tf) of the gate driving signal.

In an aspect of the present disclosure, a shift register unit is provided. The shift register unit comprises: a charging module having an input terminal and a control terminal both connected to an input terminal of the shift register unit and an output terminal connected to a pull-up node, and configured to receive an input signal and pull up a potential at the pull-up node in response to the input signal to generate a pull-up signal; a pull-up module having a control terminal connected to the pull-up node, an input terminal connected to a first clock signal terminal of the shift register unit and an output terminal connected to an output terminal of the shift register unit, and configured to receive a first clock signal and charge the output terminal of the shift register unit during a pull-up period in response to the pull-up signal; a first pull-down control module having a first control terminal and a first input terminal both connected to a second clock signal terminal of the shift register unit, a second control terminal connected to the pull-up node, a second input terminal connected to a low voltage terminal of the shift register unit and an output terminal connected to a pull-down control node, and configured to receive a second clock signal and generate a pull-down control signal at the pull-down control node in response to the second clock signal and the pull-up signal; a second pull-down control module having a first control terminal connected to the pull-down control node, a second control terminal connected to the pull-up node, a first input terminal connected to the second clock signal terminal of the shift register unit, a second input terminal connected to the low voltage terminal of the shift register unit and an output terminal connected to a pull-down node, and configured to receive the second clock signal and generate a pull-down signal at the pull-down node in response to the pull-down control signal and the pull-up signal; a first pull-down module having a control terminal connected to a first reset terminal of the shift register unit, an input terminal connected to the output terminal of the shift register unit and an output terminal connected to the low voltage terminal of the shift register unit, and configured to discharge the output terminal of the shift register unit in response to a first reset signal in a first pull-down period; a second pull-down module having a first control terminal connected to the pull-down node, a second control terminal connected to the second clock signal terminal of the shift register unit, a first input terminal connected to the output terminal of the shift register unit, a second input terminal connected to the pull-up node and an output terminal connected to the low voltage terminal of the shift register unit, and configured to discharge the output terminal of the shift register unit in response to the pull-down signal and the second clock signal in a second pull-down period; and a reset module having a control terminal connected to a second reset terminal of the shift register unit, an input terminal connected to the pull-up node and an output terminal connected to the low voltage terminal of the shift register unit, and configured to reset the pull-up node in response to a second reset signal. The pull-up module is configured to discharge the output terminal of the shift register unit in the first pull-down period.

Preferably, the charging module comprises a first transistor having a gate and a first electrode both connected to the input terminal of the shift register unit and a second electrode connected to the pull-up node.

Preferably, the reset module comprises a second transistor having a gate connected to the second reset terminal, a first electrode connected to the pull-up node and a second electrode connected to the low voltage terminal.

Preferably, the pull-up module comprises a third transistor having a gate connected to the pull-up node, a first electrode connected to the first clock signal terminal and a second electrode connected to the output terminal.

Preferably, the first pull-down module comprises a fourth transistor having a gate connected to the first reset terminal, a first electrode connected to the output terminal and a second electrode connected to the low voltage terminal.

Preferably, the second pull-down control module comprises: a fifth transistor having a gate connected to the pull-down control node, a first electrode connected to the second clock signal terminal and a second electrode connected to the pull-down node; and a sixth transistor having a gate connected to the gate of the third transistor, a first electrode connected to the pull-down node and a second electrode connected to the low voltage terminal.

Preferably, the first pull-down control module comprises: a seventh transistor having a gate connected to the gate of the third transistor, a first electrode connected to the pull-down control node and a second electrode connected to the low voltage terminal; and an eighth transistor having a gate and a first electrode both connected to the second clock signal terminal and a second electrode connected to the pull-down control node.

Preferably, the second pull-down module comprises: a ninth transistor having a gate connected to the pull-down node, a first electrode connected to the pull-up node and a second electrode connected to the low voltage terminal; a tenth transistor having a gate connected to the pull-down node, a first electrode connected to the output terminal and a second electrode connected to the low voltage terminal; and an eleventh transistor having a gate connected to the second clock signal terminal, a first electrode connected to the output terminal and a second electrode connected to the low voltage terminal.

Preferably, the pull-up module and the first pull-down module discharge the output terminal of the shift register unit simultaneously in the first pull-down period.

Preferably, the third and fourth transistors have larger dimensions than the other transistors.

Preferably, the second reset signal is delayed by a half of the actual charging time for one gate line with respect to the first reset signal.

Preferably, the first and second clock signals have opposite phases.

In another aspect of the present disclosure, a method for driving the shift register unit is provided. The method comprises: in a charging period, the charging module pulling up the potential at the pull-up node to generate the pull-up signal; in a pull-up period, the pull-up module charging the output terminal of the shift register unit in response to the pull-up signal; in a first pull-down period, the first pull-down module discharging the output terminal of the shift register unit; and in a second pull-down period, the second pull-down module discharging the output terminal of the shift register unit. The pull-up module and the first pull-down module discharge the output terminal of the shift register unit simultaneously in the first pull-down period.

In yet another aspect of the present disclosure, a shift register circuit is provided. The shift register unit comprises a number, m, of cascaded foregoing shift register units, where m is larger than or equal to 6. Each shift register unit has its output terminal connected to a corresponding gate line, and, expect the first two shift register units and the last two shift register units, the n-th shift register unit has its output terminal connected to the input terminal of the (n+2)-th shift register unit. The n-th shift register unit has its first reset terminal connected to the output terminal of the (n+2)-th shift register unit and its second reset terminal connected to the output terminal of the (n+3)-th shift register unit, where 3≤n≤m−3.

In yet another aspect of the present disclosure, a display apparatus is provided. The display apparatus comprises the shift register circuit.

With the shift register unit according to the present disclosure, the falling edge time Tf of the gate driving signal can be reduced, such that the effective charging time Teff of the pixels can be increased, thereby ensuring the display picture quality. In particular, the pull-up module and the first pull-down module discharge the output of the shift register unit simultaneously in the first pull-down period (i.e., pull down the level at the output terminal of the shift register), so as to reduce the falling edge time of the output of the shift register unit, thereby improving the discharging efficiency. Furthermore, unlike the conventional GOA design in which the pull-up module is only enabled in the pull-up period, the pull-up module in the present disclosure can not only charge the output of the shift register in the pull-up period, but also discharge the output of the shift register unit in the pull-down period. That is, the same module has different functions in different periods, thereby simplifying the circuit structure while ensuring the improved discharging efficiency.

BRIEF DESCRIPTION OF THE DRAWINGS

The above and other aspects, features and advantages of the embodiments of the present disclosure will become more apparent with reference to the following detailed description taken in conjunction with the figures, in which.

DETAILED DESCRIPTION OF THE EMBODIMENTS

The embodiments of the present disclosure provide a shift register unit and a method for driving the shift register unit, a shift register circuit and a display apparatus. The shift register unit has a short output falling edge time and a long effective charging time of pixels. The shift register circuit and the display apparatus have simple structures and low power consumptions.

In the following, the implementations of the present disclosure will be described in detail with reference to the figures and embodiments.

Figure 5:
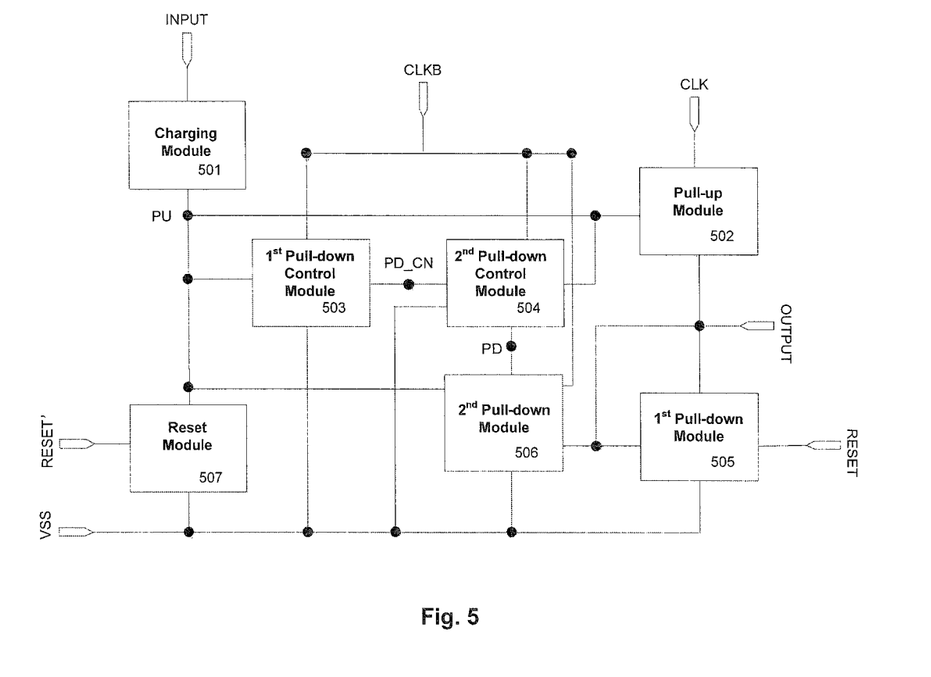
FIG. 5 is a block diagram of a shift register unit according to an embodiment of the present disclosure.

Referring to FIG. 5, which is a block diagram of a shift register unit 500 according to an embodiment of the present disclosure. The shift register unit 500 includes a charging module 501, a pull-up module 502, a first pull-down control module 503, a second pull-down control module 504, a first pull-down module 505, a second pull-down module 506 and a reset module 507.

The charging module 501 has an input terminal and a control terminal both connected to an input terminal INPUT of the shift register unit 500 and an output terminal connected to a pull-up node PU, and configured to receive an input signal and charge the pull-up node PU (i.e., pull up a potential at the pull-up node PU) in response to the input signal to generate a pull-up signal.

The pull-up module 502 has a control terminal connected to the pull-up node PU, an input terminal connected to a first clock signal terminal CLK of the shift register unit 500 and an output terminal connected to an output terminal OUTPUT of the shift register unit 500, and configured to receive a first clock signal and charge the output terminal OUTPUT of the shift register unit 500 (i.e., pull up the level at the output terminal OUTPUT) during a pull-up period in response to the pull-up signal.

The first pull-down control module 503 has a first control terminal and a first input terminal both connected to a second clock signal terminal CLKB of the shift register unit 500, a second control terminal connected to the pull-up node PU, a second input terminal connected to a low voltage terminal VSS of the shift register unit 500 and an output terminal connected to a pull-down control node PD_CN, and configured to receive a second clock signal and generate a pull-down control signal at the pull-down control node PD_CN in response to the second clock signal and the pull-up signal.

The second pull-down control module 504 has a first control terminal connected to the pull-down control node PD_CN, a second control terminal connected to the pull-up node PU, a first input terminal connected to the second clock signal terminal CLKB of the shift register unit, a second input terminal connected to the low voltage terminal VSS of the shift register unit 500 and an output terminal connected to the pull-down node PD, and configured to receive the second clock signal and generate a pull-down signal at the pull-down node PD in response to the pull-down control signal and the pull-up signal.

The first pull-down module 505 has a control terminal connected to a first reset terminal RESET of the shift register unit 500, an input terminal connected to the output terminal OUTPUT of the shift register unit 500 and an output terminal connected to the low voltage terminal VSS of the shift register unit 500, and configured to discharge the output terminal OUTPUT of the shift register unit 500 (i.e., pull down the potential at the output terminal OUTPUT of the shift register unit 500 to the low voltage of the shift register unit 500) in response to a first reset signal in a first pull-down period.

The second pull-down module 506 has a first control terminal connected to the pull-down node PD, a second control terminal connected to the second clock signal terminal CLKB of the shift register unit, a first input terminal connected to the output terminal OUTPUT of the shift register unit 500, a second input terminal connected to the pull-up node PU and an output terminal connected to the low voltage terminal VSS of the shift register unit 500, and configured to discharge the output terminal OUTPUT of the shift register unit 500 (i.e., pull down the potential at the output terminal OUTPUT of the shift register unit 500 to the low voltage of the shift register unit 500) in response to the pull-down signal and the second clock signal in a second pull-down period.

The reset module 507 has a control terminal connected to a second reset terminal RESET' of the shift register unit 500, an input terminal connected to the pull-up node PU and an output terminal connected to the low voltage terminal VSS of the shift register unit 500, and configured to reset the pull-up node PU in response to a second reset signal.

In this embodiment, the first pull-down module 505 is connected to the first reset terminal of the shift register unit 500 separately, i.e., to provide the first pull-down module 505 with a separate reset signal. The first reset signal, reset, provided to the first pull-down module 505 differs from the second reset signal, reset', provided to the reset module 507 in that the second reset signal, reset', is delayed by a half of the actual charging time for one gate line (i.e., 1H) with respect to the first reset signal, reset.

In the conventional shift register unit as shown in FIG. 3, the first pull-down module 505 and the reset module 507 are connected to the same reset terminal. Once the scanning of one gate line has completed, the first clock signal becomes low, the reset signal becomes high, and the reset module 507 causes the pull-up node PU to be floated (i.e., the pull-up node PU becomes low). In this case, the pull-up module 502 is disabled and the first pull-down module 505 and the second pull-down module 506 are enabled to pull down the level at the output terminal of the shift register unit.

However, according to this embodiment, once the scanning of one gate line has completed, the first clock signal becomes low, the reset signal provided to the first pull-down module 505 is at the high level, and the first pull-down module 505 pulls down the level at the output terminal of the shift register unit. At the same time, since the second reset signal reset' provided to the reset module 507 is still at the low level and accordingly the pull-up node PU connected to the pull-up module 502 is still at the high level, the pull-up module 502 is still enabled. Further, since the first clock signal provided to the pull-up module 502 becomes low at this time, the pull-up module 502 and the first pull-down module 505 discharge the output terminal of the shift register unit simultaneously. In this way, since the pull-up module 502 and the first pull-down module 505 discharge the output terminal OUTPUT of the shift register unit 500 simultaneously in the first pull-down period, the discharging efficiency of the output terminal of the shift register unit can be improved, the fall edge time Tf of the gate driving signal can be further reduced and the effective charging time Teff of the pixel can thus be increased. After 1H has lapsed, the second reset signal reset' connected to the reset module 507 becomes high, such that the pull-up node PU becomes low and thus the pull-up module 502 is disabled. In this case, since the pull-up node PU becomes low and the second pull-down module 506 is enabled, the output terminal of the shift register unit 500 continues to be discharged. Meanwhile, the first reset signal connected to the first pull-down module 505 becomes low and the first pull-down module 505 is disabled.

Furthermore, the pull-up module in the present disclosure can not only charge the output of the shift register in the pull-up period, but also discharge the output of the shift register unit in the pull-down period. That is, the same module has different functions in different periods, thereby simplifying the circuit structure while ensuring the improved discharging efficiency.

A circuit diagram showing the respective modules of the shift register unit 500 according to an embodiment of the present disclosure will be described below with reference to FIG. 6.

Figure 6:
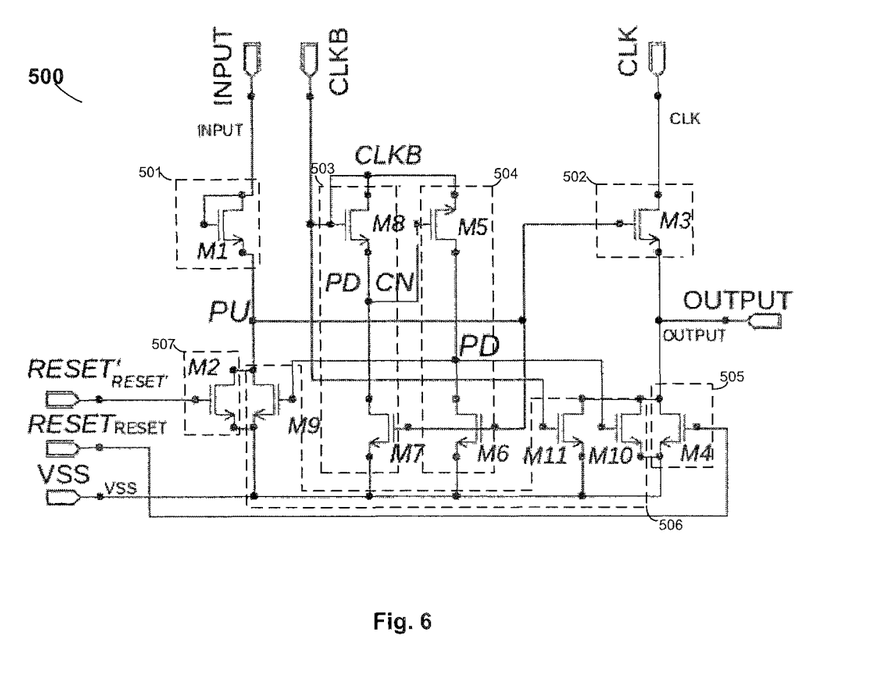
FIG. 6 is a circuit diagram of a shift register unit of FIG. 5 according to an embodiment of the present disclosure.

FIG. 6 is a circuit diagram showing the respective modules of the shift register unit 500 according to an embodiment of the present disclosure.

Referring to FIG. 6, the charging module 501 includes a first transistor M1. The first transistor M1 has a gate and a first electrode both connected to the input terminal INPUT of the shift register unit 500 and a second electrode connected to the pull-up node PU. In this embodiment, for M1, its gate corresponds to the control terminal of the charging module 501, its first electrode corresponds to the input terminal of the charging module 501 and its second electrode corresponds to the output terminal of the charging module 501.

The reset module 507 includes a second transistor M2. The second transistor M2 has a gate connected to the second reset terminal RESET', a first electrode connected to the pull-up node PU and a second electrode connected to the low voltage terminal VSS. In this embodiment, for M2, its gate corresponds to the control terminal of the reset module 507, its first electrode corresponds to the input terminal of the reset module 507 and its second electrode corresponds to the output terminal of the reset module 507.

The pull-up module 502 includes a third transistor M3. The third transistor M3 has a gate connected to the pull-up node PU, a first electrode connected to the first clock signal terminal CLK and a second electrode connected to the output terminal OUTPUT. In this embodiment, for M3, its gate corresponds to the control terminal of the pull-up module 502, its first electrode corresponds to the input terminal of the pull-up module 502 and its second electrode corresponds to the output terminal of the pull-up module 502.

The first pull-down module 505 includes a fourth transistor M4. The fourth transistor M4 has a gate connected to the first reset terminal RESET, a first electrode connected to the output terminal OUTPUT and a second electrode connected to the low voltage terminal VSS. In this embodiment, for M4, its gate corresponds to the control terminal of the first pull-down module 505, its first electrode corresponds to the input terminal of the first pull-down module 505 and its second electrode corresponds to the output terminal of the first pull-down module 505.

The second pull-down control module 504 includes a fifth transistor M5 and a sixth transistor M6. The fifth transistor M5 has a gate connected to the pull-down control node PD_CN, a first electrode connected to the second clock signal terminal CLKB and a second electrode connected to the pull-down node PD. The sixth transistor M6 has a gate connected to the gate of the third transistor M3 (i.e., the pull-up node PU), a first electrode connected to the pull-down node PD and a second electrode connected to the low voltage terminal VSS. Here, the first clock signal at the first clock signal terminal CLK and the second clock signal at the second clock signal CLKB have opposite phases. In this embodiment, for M5, its gate corresponds to the first control terminal of the second pull-down control module 504, its first electrode corresponds to the first input terminal of the second pull-down control module 504 and its second electrode corresponds to the output terminal of the second pull-down control module 504. For M6, its gate corresponds to the second control terminal of the second pull-down control module 504, its first electrode corresponds to the output terminal of the second pull-down control module 504 and its second electrode corresponds to the second input terminal of the second pull-down control module 504.

The first pull-down control module 503 includes a seventh transistor M7 and an eighth transistor M8. The seventh transistor M7 has a gate connected to the gate of the third transistor M3 (i.e., the pull-up node PU), a first electrode connected to the pull-down control node PD_CN and a second electrode connected to the low voltage terminal VSS. The eighth transistor M8 has a gate and a first electrode both connected to the second clock signal terminal CLKB and a second electrode connected to the pull-down control node PD_CN. In this embodiment, for M7, its gate corresponds to the second control terminal of the first pull-down control module 503, its first electrode corresponds to the output terminal of the first pull-down control module 503 and its second electrode corresponds to the second input terminal of the first pull-down control module 503. For M8, its gate corresponds to the first control terminal of the first pull-down control module 503, its first electrode corresponds to the first input terminal of the first pull-down control module 503 and its second electrode corresponds to the output terminal of the first pull-down control module 503.

The second pull-down module 506 includes a ninth transistor M9, a tenth transistor M10 and an eleventh transistor M11. The ninth transistor M9 has a gate connected to the pull-down node PD, a first electrode connected to the pull-up node PU and a second electrode connected to the low voltage terminal VSS. The tenth transistor M10 has a gate connected to the pull-down node PD, a first electrode connected to the output terminal OUTPUT and a second electrode connected to the low voltage terminal VSS. The eleventh transistor M11 has a gate connected to the second clock signal terminal CLKB, a first electrode connected to the output terminal OUTPUT and a second electrode connected to the low voltage terminal VSS. In this embodiment, for M9, its gate corresponds to the first control terminal of the second pull-down module 506, its first electrode corresponds to the second input terminal of the second pull-down module 506 and its second electrode corresponds to the output terminal of the second pull-down module 506. For M10, its gate corresponds to the first control terminal of the second pull-down module 506, its first electrode corresponds to the first input terminal of the second pull-down module 506 and its second electrode corresponds to the output terminal of the second pull-down module 506. For M11, its gate corresponds to the second control terminal of the second pull-down module 506, its first electrode corresponds to the first input terminal of the second pull-down module 506 and its second electrode corresponds to the output terminal of the second pull-down module 506.

In this embodiment, the first reset signal, reset, is provided to the gate of the transistor M4 and the second reset signal, reset', is provided to the gate of the transistor M2. Here the second reset signal, reset', is delayed by a half of the actual charging time for one gate line (i.e., 1H) with respect to the first reset signal, reset. Once the scanning of one gate line has completed (i.e., after the pull-up period), the first clock signal becomes low, the first reset signal, reset, provided to the transistor M4 is at the high level, the transistor M4 is turned on to discharge the output terminal of the shift register unit. At the same time, since the pull-up node PU is still at the high level, the transistor M3, whose gate is connected to the pull-up node PU and first electrode connected to the first clock signal at the low level, is still on, and the output terminal of the shift register unit is discharged. Thus, the transistors M3 and M4 discharge the output terminal of the shift register unit simultaneously. After 1H has lapsed, since the second reset signal, reset', is on, the second transistor M2 is turned on. Meanwhile, since the pull-up node PU becomes low, the transistor M3 is turned off. Since the first reset signal, reset, becomes low, the transistor M4 is turned off. At this time, since the second clock signal is at the high level, the second pull-down module 506 is enabled to continue discharging the output terminal of the shift register unit 500. In this way, the transistors M3 and M4 discharge the output terminal OUTPUT of the shift register unit 500 simultaneously in the first pull-down period, the discharging efficiency of the output terminal of the shift register unit can be improved, the fall edge time Tf of the gate driving signal can be further reduced and the effective charging time Teff of the pixel can thus be increased.

Further, according to this embodiment, since the transistors M3 and M4 discharge the output terminal of the shift register unit, they have much larger dimensions than the other transistors.

It is to be noted that, in the above example as shown in FIG. 6, the transistors M1-M11 can be N-type Thin Film Transistors (TFTs). However, the present disclosure is not limited to any specific type of the above transistors. For example, the transistors M1-M11 can be P-type TFTs.

In this embodiment, the two electrodes other than the gate in a transistor are source and drain. Due to the symmetry in the transistor structure, the functions of the source and drain of the transistor can be exchanged with each other. That is, the first electrode can be the source and the second electrode can be the drain, or vice versa.

Figure 7:
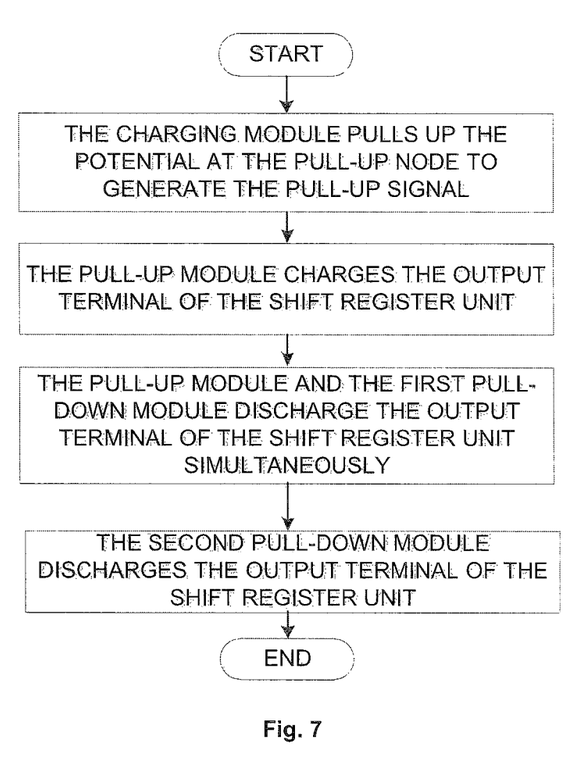
FIG. 7 is a flowchart illustrating a method for driving a shift register unit according to an embodiment of the present disclosure.

In the following, a method for driving a shift register unit according to an embodiment of the present disclosure will be described in detail with reference to FIG. 7. The method includes a charging period, a pull-up period, a first pull-down period and a second pull-down period.

In the charging period, the charging module 501 shown in FIG. 5 charges the pull-up node PU in response to the input signal at the input terminal INPUT (i.e., pulling up the potential at the pull-up node PU), to generate the pull-up signal. In this case, the output terminal OUTPUT of the shift register unit is at the low level.

In the pull-up period, the first clock signal at the high level is output at the first clock signal terminal CLK. The pull-up module 502 charges the output terminal OUTPUT of the shift register unit in response to the pull-up signal at the high level (i.e., the pull-up node PU is at the high level) and the first clock signal at the high level. The output terminal OUTPUT is pulled up from low level to high level and the pull-up node PU is still at the high level.

In the first pull-down period, the first reset signal, reset, at the high level is output at the reset terminal RESET. Accordingly, the first pull-down module 505 discharges the output terminal OUTPUT of the shift register unit in response to the first reset signal RESET, such that the output terminal OUTPUT is pulled down from high level in the pull-up period to low level. Since in the first pull-down period the first clock signal terminal CLK becomes low and the pull-up node PU is still at the high level, the pull-up module 502 also discharges the output terminal OUTPUT. Further, while at this time the second clock signal at the high level is output at the second clock signal terminal CLKB, the pull-up node PU is at the high level. By adjusting the dimensions of the transistors M8 and M7 of the first pull-down control module 503, the pull-down control signal output from the first pull-down control module 503 turns off the transistors M5 and M6 of the second pull-down control module 504, such that the second pull-down module 506 is disabled in response to the pull-down signal.

Finally, in the second pull-down period after 1H has lapsed, a second reset signal, reset', at the high level is output at the reset terminal RESET'. The reset module 507 pulls down the pull-up node PU from the high level in the pull-up period to the low level, such that the pull-up module 502 is disabled, i.e., the discharging of the output terminal OUTPUT is stopped. Meanwhile, in the second pull-down period, the first reset signal, reset, becomes low and the first pull-down module 505 is disabled. Since the pull-up node PU becomes low, the second pull-down module 506 continues discharging the output terminal OUTPUT in response to the second clock signal at the high level.

In this way, the pull-up module 502 and the first pull-down module 505 discharge the output terminal of the shift register unit simultaneously in the first pull-down period, such that the level at the output terminal can be pulled down rapidly and the pull-down time can be shortened.

Figure 8:
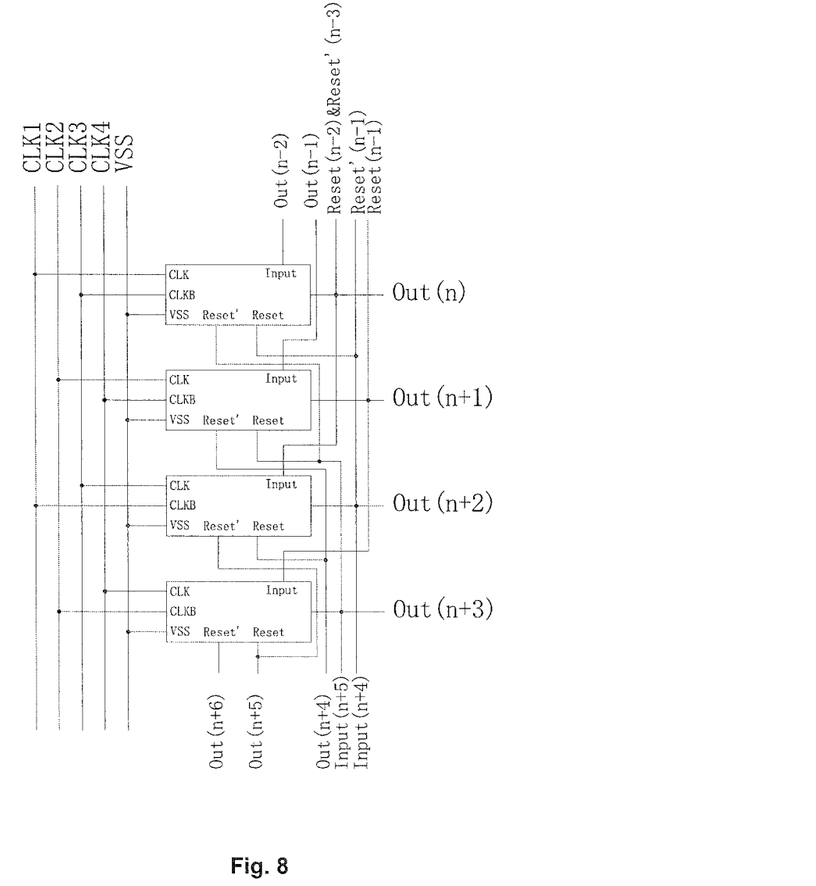
FIG. 8 is a block diagram of a shift register circuit including a number of cascaded shift register units of FIG. 5.

FIG. 8 is a block diagram of a shift register circuit 800 including a number of cascaded shift register units 500 of FIG. 5.

The shift register circuit 800 includes a number, m, of cascaded shift register units 500, where m is larger than or equal to 6. Each shift register unit has its output terminal connected to a corresponding gate line. Expect the first two shift register units and the last two shift register units, the n-th shift register unit has its output terminal connected to the input terminal of the (n+2)-th shift register unit. In addition, it differs from FIG. 4 in that each shift register unit includes two reset terminals. The n-th shift register unit has its first reset terminal (Reset) connected to the output terminal of the (n+2)-th shift register unit and its second reset terminal (Reset') connected to the output terminal of the (n+3)-th shift register unit.

The timing sequence of the clock signals shown in FIG. 8 is shown in FIG. 1.

Here, 3≤n≤m−3. In addition, in order to reduce the power consumption of the shift register circuit, four or more clock signals are typically provided. Preferably, the number of clock signals is a multiple of 2. Meanwhile, the frequencies of the clock signals can be reduced, so as to reduce the power consumption.

Typically, the input terminal of the first shift register unit is connected to a frame start signal STV1, the input terminal of the second shift register unit is also connected to the frame start signal STV1. The last three shift register units are typically dummy units and their reset signal terminals can be connected to the frame start signal STV1, such that, upon arrival of the next cycle, the last three shift register units can be reset by the frame start signal STV1 for cycling of the timing sequence (not shown in FIG. 8).

The shift register circuit according to this embodiment has a long effective charging time for pixels, a simple structure and a low power consumption.

According to an embodiment of the present disclosure, a display apparatus is provided. The display apparatus includes the above shift register circuit. The display apparatus can be e.g., a liquid crystal panel, e-paper, an OLED panel, a mobile phone, a tablet computer, a TV set, a display, a notebook computer, a digital frame, a navigator or any other products or components having display functions.

Various alternatives and modifications can be made to the embodiments of the present disclosure by those skilled in the art without departing from the spirit and scope of the present disclosure. The scope of the present disclosure is defined only by the claims as attached and the equivalents thereof.

What is claimed is:

1. A shift register unit, comprising:
a charging module having an input terminal and a control terminal both connected to an input terminal of the shift register unit and an output terminal connected to a pull-up node, and configured to receive an input signal and pull up a potential at the pull-up node in response to the input signal to generate a pull-up signal;
a pull-up module having a control terminal connected to the pull-up node, an input terminal connected to a first clock signal terminal of the shift register unit and an output terminal connected to an output terminal of the shift register unit, and configured to receive a first clock signal and charge the output terminal of the shift register unit during a pull-up period in response to the pull-up signal;
a first pull-down control module having a first control terminal and a first input terminal connected both to a second clock signal terminal of the shift register unit, a second control terminal connected to the pull-up node, a second input terminal connected to a low voltage terminal of the shift register unit and an output terminal connected to a pull-down control node, and configured to receive a second clock signal, and generate a pull-down control signal at the pull-down control node in response to the second clock signal;
a second pull-down control module having a first control terminal connected to the pull-down control node, a second control terminal connected to the pull-up node, a first input terminal connected to the second clock signal terminal of the shift register unit, a second input terminal connected to the low voltage terminal of the shift register unit and an output terminal connected to a pull-down node, and configured to receive the second clock signal and generate a pull-down signal at the pull-down node in response to the pull-down control signal and the pull-up signal;
a first pull-down module having a control terminal connected to a first reset terminal of the shift register unit, an input terminal connected to the output terminal of the shift register unit and an output terminal connected to the low voltage terminal of the shift register unit, and configured to discharge the output terminal of the shift register unit in response to a first reset signal in a first pull-down period;
a second pull-down module having a first control terminal connected to the pull-down node, a second control terminal connected to the second clock signal terminal of the shift register unit, a first input terminal connected to the output terminal of the shift register unit, a second input terminal connected to the pull-up node and an output terminal connected to the low voltage terminal of the shift register unit, and configured to discharge the output terminal of the shift register unit in response to the pull-down signal and the second clock signal in a second pull-down period; and
a reset module having a control terminal connected to a second reset terminal of the shift register unit, an input terminal connected to the pull-up node and an output terminal connected to the low voltage terminal of the shift register unit, and configured to reset the pull-up node in response to a second reset signal in the second pull-down period,
wherein the first and second clock signals have opposite phases, the second pull-down module is configured to be disabled in the first pull-down period, and the pull-up module is configured to discharge the output terminal of the shift register unit in the first pull-down period,
wherein the first pull-down control module comprises: a seventh transistor having a gate connected to the gate of a third transistor of the pull-up module, a first electrode connected to the pull-down control node and a second electrode connected to the low voltage terminal; and an eighth transistor having a gate and a first electrode both connected to the second clock signal terminal and a second electrode connected to the pull-down control node,
wherein the seventh transistor and the eighth transistor are selected so that the first pull-down control-module maintains a potential at the pull-down control node at low it response to both the second clock signal and the pull-up signal being high in the first pull-down period, and pulls up the potential at the pull-down control node in response to the second clock signal being high and the pull-up signal being low in the second pull-down period.

2. The shift register unit of claim 1, wherein the charging module comprises a first transistor having a gate and a first electrode both connected to the input terminal of the shift register unit and a second electrode connected to the pull-up node.

3. The shift register unit of claim 1, wherein the reset module comprises a second transistor having a gate connected to the second reset terminal, a first electrode connected to the pull-up node and a second electrode connected to the low voltage terminal.

4. The shift register unit of claim 1, wherein the pull-up module comprises the third transistor having a gate connected to the pull-up node, a first electrode connected to the first clock signal terminal and a second electrode connected to the output terminal.

5. The shift register unit of claim 1, wherein the first pull-down module comprises a fourth transistor having a gate connected to the first reset terminal, a first electrode connected to the output terminal and a second electrode connected to the low voltage terminal.

6. The shift register unit of claim 1, wherein the second pull-down control module comprises: a fifth transistor having a gate connected to the pull-down control node, a first electrode connected to the second clock signal terminal and a second electrode connected to the pull-down node; and a sixth transistor having a gate connected to the gate of the third transistor, a first electrode connected to the pull-down node and a second electrode connected to the low voltage terminal.

7. The shift register unit of claim 1, wherein the second pull-down module comprises: a ninth transistor having a gate connected to the pull-down node, a first electrode connected to the pull-up node and a second electrode connected to the low voltage terminal; a tenth transistor having a gate connected to the pull-down node, a first electrode connected to the output terminal and a second electrode connected to the low voltage terminal; and an eleventh transistor having a gate connected to the second clock signal terminal, a first electrode connected to the output terminal and a second electrode connected to the low voltage terminal.

8. The shift register unit of claim 1, wherein the pull-up module and the first pull-down module discharge the output terminal of the shift register unit simultaneously in the first pull-down period.

9. The shift register unit of claim 1, wherein the pull-up module comprises the third transistor having a gate connected to the pull-up node, a first electrode connected to the first clock signal terminal and a second electrode connected to the output terminal, wherein the first pull-down module comprises a fourth transistor having a gate connected to the first reset terminal, a first electrode connected to the output terminal and a second electrode connected to the low voltage terminal, and wherein the third and fourth transistors have larger dimensions than transistors in other modules.

10. The shift register unit of claim 1, wherein the second reset signal is delayed by a half of the actual charging time for one gate line with respect to the first reset signal.

11. A method for driving a shift register unit according to claim 1, comprising:
   in a charging period, the charging module pulling up the potential at the pull-up node to generate the pull-up signal;
   in a pull-up period, the pull-up module charging the output terminal of the shift register unit in response to the pull-up signal;
   in a first pull-down period, the first pull-down module discharging the output terminal of the shift register unit; and
   in a second pull-down period, the second pull-down module discharging the output terminal of the shift register unit,
   wherein the pull-up module and the first pull-down module discharge the output terminal of the shift register unit simultaneously in the first pull-down period.

12. A shift register circuit, comprising a number, m, of cascaded shift register units according to claim 1, where m is larger than or equal to 6, wherein each shift register unit has its output terminal connected to a corresponding gate line, and, expect the first two shift register units and the last two shift register units, the n-th shift register unit has its output terminal connected to the input terminal of the (n+2)-th shift register unit, and
   wherein the n-th shift register unit has its first reset terminal connected to the output terminal of the (n+2)-th shift register unit and its second reset terminal connected to the output terminal of the (n+3)-th shift register unit, where $3 \leq n \leq m-3$.

13. A display apparatus comprising a shift register circuit according to claim 12.

14. The shift register circuit of claim 12, wherein the pull-up module comprises the third transistor having a gate connected to the pull-up node, a first electrode connected to the first clock signal terminal and a second electrode connected to the output terminal.

15. The shift register circuit of claim 12, wherein the first pull-down module comprises a fourth transistor having a gate connected to the first reset terminal, a first electrode connected to the output terminal and a second electrode connected to the low voltage terminal.

16. The shift register circuit of claim 12, wherein the second pull-down control module comprises: a fifth transistor having a gate connected to the pull-down control node, a first electrode connected to the second clock signal terminal and a second electrode connected to the pull-down node; and a sixth transistor having a gate connected to the gate of the third transistor, a first electrode connected to the pull-down node and a second electrode connected to the low voltage terminal.

17. The shift register circuit of claim 12, wherein the second pull-down module comprises: a ninth transistor having a gate connected to the pull-down node, a first electrode connected to the pull-up node and a second electrode connected to the low voltage terminal; a tenth transistor having a gate connected to the pull-down node, a first electrode connected to the output terminal and a second electrode connected to the low voltage terminal; and an eleventh transistor having a gate connected to the second clock signal terminal, a first electrode connected to the output terminal and a second electrode connected to the low voltage terminal.

* * * * *